United States Patent
Tanaka et al.

(10) Patent No.: US 7,696,771 B2
(45) Date of Patent: Apr. 13, 2010

(54) TEST APPARATUS AND TEST METHOD

(75) Inventors: Koichi Tanaka, Tokyo (JP); Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 62 days.

(21) Appl. No.: 12/042,343

(22) Filed: Mar. 5, 2008

(65) Prior Publication Data

US 2009/0058452 A1    Mar. 5, 2009

Related U.S. Application Data

(63) Continuation of application No. PCT/JP2006/316165, filed on Aug. 17, 2006.

(30) Foreign Application Priority Data

Sep. 6, 2005    (JP) .............................. 2005-257435

(51) Int. Cl.
  *G01R 31/26*    (2006.01)
(52) U.S. Cl. ..................................... 324/765
(58) Field of Classification Search ........................ None
  See application file for complete search history.

(56) References Cited

U.S. PATENT DOCUMENTS

| | | | |
|---|---|---|---|
| 4,631,724 A | 12/1986 | Shimizu | |
| 5,369,375 A * | 11/1994 | Cooper et al. | 324/207.16 |
| 6,407,571 B1 * | 6/2002 | Furuya et al. | 324/765 |
| 6,472,888 B2 * | 10/2002 | Oguma et al. | 324/691 |
| 6,982,555 B2 * | 1/2006 | Yamashita et al. | 324/519 |
| 7,250,807 B1 * | 7/2007 | Doyle | 327/534 |
| 7,301,359 B2 * | 11/2007 | Furukawa | 324/765 |
| 7,394,234 B2 * | 7/2008 | Kodera | 324/763 |
| 7,486,059 B2 * | 2/2009 | Kodera | 324/771 |
| 7,511,547 B2 * | 3/2009 | Suda et al. | 327/276 |

(Continued)

FOREIGN PATENT DOCUMENTS

DE    101 14 001 A1    12/2001

(Continued)

OTHER PUBLICATIONS

Article Titled "Dengen Denryu ni yoru Kumiawase Kairo no Kosho Kenshutsuho" jointly authored by Kazuhiro Yamada et al., in IEICE Technical Report, vol. 88, No. 230, 1988 (pp. 1-8).

(Continued)

*Primary Examiner*—Jermele M Hollington
(74) *Attorney, Agent, or Firm*—Osha • Liang LLP

(57)    ABSTRACT

Provided is a test apparatus that tests fluctuation of a power supply voltage supplied to a device under test, including an oscillator that outputs a clock signal having a frequency that corresponds to the power supply voltage supplied to the power supply input terminal of the device under test, and a measuring section that measures the frequency of the clock signal. For example, the oscillator outputs as the clock signal an output signal of any one negative logic element from among an odd number of negative logic elements connected in a loop, and at least one of the negative logic elements operates using, as a voltage source, a voltage corresponding to the power supply voltage supplied to the power supply input terminal of the device under test.

22 Claims, 5 Drawing Sheets

U.S. PATENT DOCUMENTS

| | | | |
|---|---|---|---|
| 2001/0010467 A1* | 8/2001 | Oguma et al. | 324/601 |
| 2001/0030558 A1* | 10/2001 | Ikoma et al. | 327/143 |
| 2004/0247066 A1 | 12/2004 | Suda | |
| 2005/0168253 A1* | 8/2005 | Hirayama et al. | 327/156 |
| 2006/0267656 A1* | 11/2006 | Suda et al. | 327/261 |
| 2008/0136469 A1* | 6/2008 | Matsuse | 327/151 |
| 2009/0160536 A1* | 6/2009 | Suda | 327/538 |

FOREIGN PATENT DOCUMENTS

| | | |
|---|---|---|
| JP | 63-184075 | 7/1988 |
| JP | 02-002953 | 1/1990 |
| JP | 2-7582 | 1/1990 |
| JP | 2-143839 | 12/1990 |
| JP | 02-143839 U1 | 12/1990 |
| JP | 06-174764 | 6/1994 |
| JP | 09-264928 | 10/1997 |
| JP | 10-132872 | 5/1998 |
| JP | 2001-221830 | 8/2001 |

OTHER PUBLICATIONS

Office Action issued in German Application No. 11 2006 002 395.0-35 mailed on October 7, 2009 and English translation thereof, 12 pages.

Schrüfer, Elmar: Elektrische Meβtechnik. 1. Auflage, München [u.a.]: Hanser-Verlag, 1983, Seiten 313-316, 318-319. ISBN 3-446-13812-9.

* cited by examiner

TEST APPARATUS AND TEST METHOD

CROSS REFERENCE TO RELATED APPLICATION

This is a continuation application of PCT/JP2006/316165 filed on Aug. 17, 2006 which claims priority from a Japanese Patent Application NO. 2005-257435 filed on Sep. 6, 2005, the contents of which are incorporated herein by reference.

BACKGROUND

1. Technical Field

The present invention relates to a test apparatus and a test method. More particularly, the present invention relates to a test apparatus and a test method for testing fluctuation of a power supply voltage supplied to a device under test.

2. Related Art

A test apparatus for a semiconductor device tests whether the semiconductor device fulfills certain specifications. One type of test performed by a test apparatus is a power supply voltage fluctuation analysis test. When performing the power supply voltage fluctuation analysis test, the test apparatus changes the consumed current by moving the semiconductor device from a standby mode to a maximum operational mode and measures the resulting voltage fluctuation of the power supply voltage.

In conventional power supply voltage fluctuation analysis tests, it is common to directly measure fluctuation of the power supply voltage of the semiconductor device using an analog-digital converter (hereinafter referred to as an "ADC").

Because no prior art documents are known at this time, a description thereof is omitted.

When measuring the power supply voltage fluctuation using the ADC, however, a circuit size of the test apparatus becomes undesirably large. Furthermore, when measuring the power supply voltage fluctuation using the ADC, it is difficult to increase the accuracy of the measurement.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a test apparatus that tests fluctuation of a power supply voltage supplied to a device under test, including an oscillator that outputs a clock signal having a frequency that corresponds to the power supply voltage supplied to a power supply input terminal of the device under test, and a measuring section that measures the frequency of the clock signal.

According to a second aspect related to the innovations herein, one exemplary method may include a test method for testing a fluctuation amount of a power supply voltage supplied to a device under test, that includes supplying the power supply voltage to a power supply input terminal of the device under test, outputting a clock signal that has a frequency corresponding to the power supply voltage supplied to the power supply input terminal of the device under test, and measuring the frequency of the clock signal.

The summary of the invention does not necessarily describe all necessary features of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
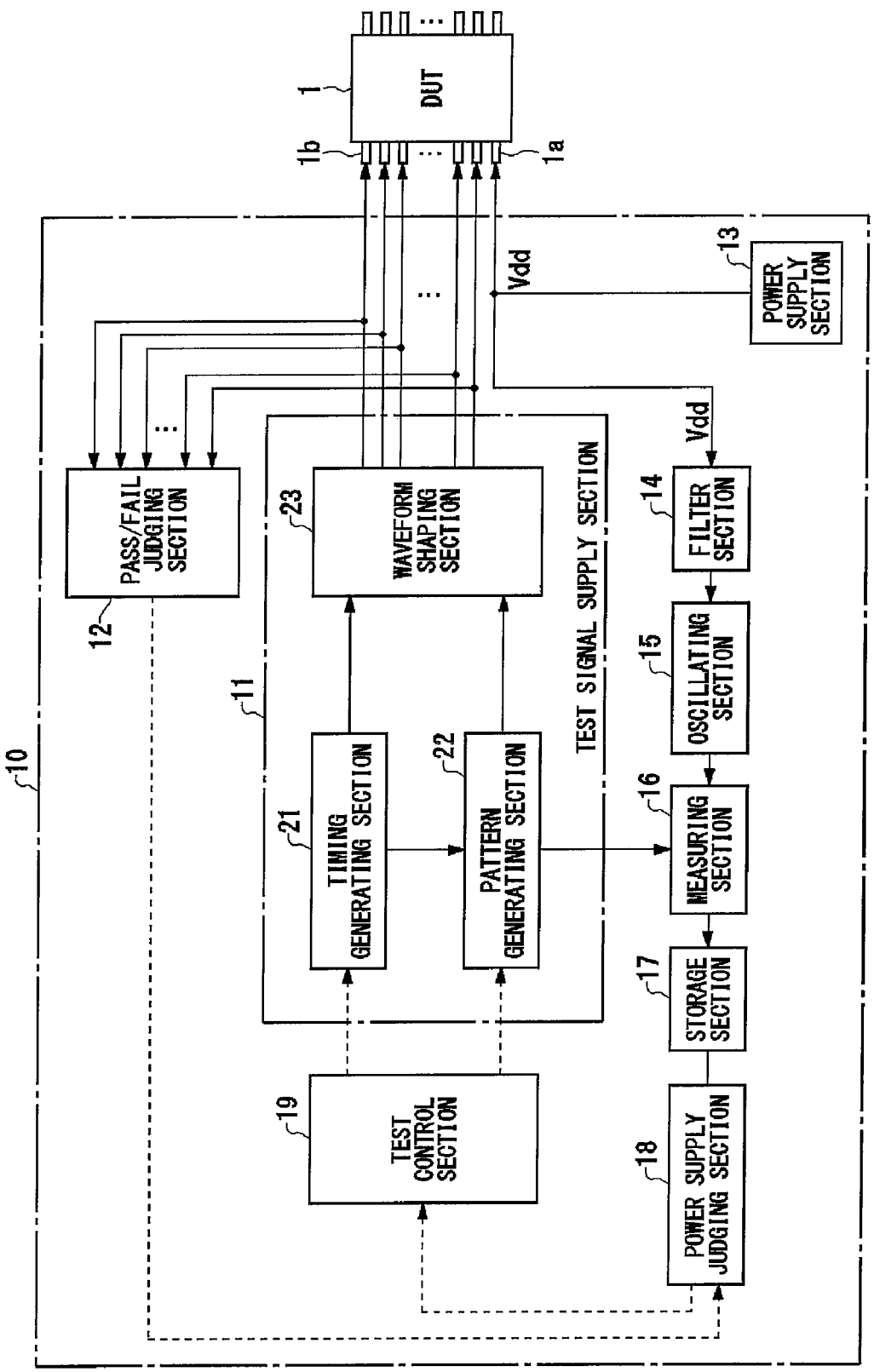
FIG. 1 shows a configuration of a test apparatus 10 according to a present embodiment.

FIG. 1 shows a configuration of a test apparatus 10 according to the present embodiment.

The test apparatus 10 according to the present embodiment tests a device under test 1 (hereinafter referred to as a "DUT") such as a semiconductor device. More specifically, the test apparatus 10 supplies to power supply input terminal 1a of the DUT 1 a test signal that causes the power supply voltage supplied thereto to fluctuate and effectively measures the fluctuation amount of the power supply voltage Vdd that is a result of the change in the current consumed by the DUT 1.

The test apparatus 10 is provided with a test signal supply section 11, a pass/fail judging section 12, a power supply section 13, a filter section 14, an oscillating section 15, a measuring section 16, a storage section 17, a power supply judging section 18, and a test control section 19. The power supply section an other of the above components may be provided outside of the test apparatus 10.

The test signal supply section 11 supplies a test signal that causes the DUT 1 to operate to signal terminals 1b of the DUT 1. The test signal supply section 11 includes a timing generating section 21, a pattern generating section 22, and a waveform shaping section 23.

The timing generating section 21 generates a reference clock that designates a test period in which the test signal is supplied and a timing edge that designates a timing at which the test signal is changed. The pattern generating section 22 stores thereon a test pattern and outputs the stored test pattern according to the reference clock. The test pattern is information for designating a waveform of the test signal supplied to the signal terminals 1b of the DUT 1. The waveform shaping section 23 shapes the test signal based on the test pattern output by the pattern generating section 22 and the timing edge generated by the timing generating section 21. The waveform shaping section 23 supplies the thus formed test signal to each signal terminal 1b of the DUT 1.

The pass/fail judging section 12 makes a judgment concerning pass/fail of the DUT 1 by comparing an expected value to the output signal output by the DUT 1 in response to the test signal supplied from the test signal supply section 11. More specifically, the pass/fail judging section 12 makes a judgment that the DUT 1 is non-defective when the output signal is judged to be identical to the expected value and makes a judgment that the DUT 1 is defective when the output signal is judged to be different from the expected value.

The power supply section 13 supplies the power supply voltage Vdd to the power supply input terminal 1a of the DUT 1. The power supply section 13 is a voltage source that is independent from a voltage source for operating each component of the test apparatus 10. Accordingly, the fluctuation of the power supply voltage Vdd does not exert any affect on the frequency of the reference clock generated by the timing generating section 21 of the test signal supply section 11. Alternatively, the power supply section 13 may be the same as the voltage source of the test apparatus 10.

The power supply voltage Vdd supplied to the power supply input terminal 1a of the DUT 1 is input to the filter section 14. The filter section 14 eliminates a DC component from the input power supply voltage Vdd and outputs a voltage obtained by superimposing a remaining AC component onto a prescribed voltage level. In this manner, the filter section 14 outputs, with the prescribed voltage level as a reference, a voltage that fluctuates according to a fluctuation amount of the power supply voltage Vdd.

The oscillating section 15 generates a clock signal having a frequency that corresponds to the voltage supplied from the filter section 14. In other words, the oscillating section 15 outputs a clock signal having a frequency corresponding to the power supply voltage Vdd from which the DC component is eliminated. In the present embodiment, the oscillator 15 generates a clock signal that has a higher frequency when the power supply voltage Vdd is higher and a lower frequency when the power supply voltage Vdd is lower.

The measuring section 16 measures the frequency of the clock signal output from the oscillating section 15. More specifically, the measuring section 16 measures a number of pulses in the clock signal within a predetermined reference period (e.g., within a prescribed period of the reference clock). Alternatively, the measuring section 16 may measure the number of pulses in the clock signal within a period that is determined according to the test pattern, for example, and the measuring period may be arbitrarily changed.

The storage section 17 sequentially stores thereon the number of pulses in the clock signal in each reference period measured by the measuring section 16.

The power supply judging section 18 reads the number of pulses in the clock signal in each reference period stored in the storage section 17 and makes a judgment as to whether the fluctuation amount of the power supply voltage Vdd is within an allowable range based on the read number of pulses. More specifically, the power supply judging section 18 makes a judgment as to whether the fluctuation amount of the power supply voltage is within the allowable range based on a difference between the frequency of the clock signal when the test signal is supplied to the DUT 1 and the frequency of the clock signal when the test signal is not supplied to the DUT 1. The test signal supply section 11 supplies a preset test signal that causes the DUT 1 to move from a standby mode to an operational mode. The power supply judging section 18 makes a judgment as to whether the fluctuation amount of the power supply voltage Vdd, which is caused by the DUT 1 moving from the standby mode to the operational mode in response to the test signal, is within the allowable range based on the frequency measured by the measuring section 16.

The test control section 19 controls overall operation of the test signal supply section 11.

Figure 2:
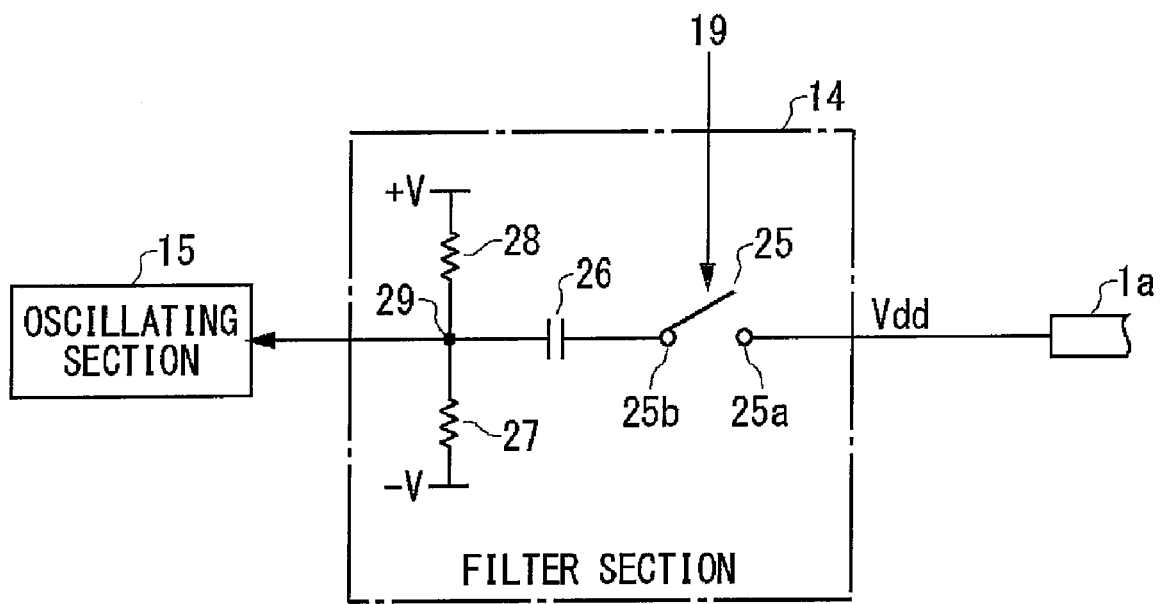
FIG. 2 shows an exemplary configuration of a filter section 14 according to a present embodiment.

FIG. 2 shows an exemplary configuration of the filter section 14.

The filter section 14 includes a switch 25, a capacitor 26, a pull down resistor 27, and a pull up resistor 28, for example.

The switch 25 has a terminal 25a at one end connected to the power supply input terminal 1a of the DUT 1 and has a terminal 25b at the other end connected to a terminal at one end of the capacitor 26. The switch 25 provides a connection or an opening between the terminals 25a, 25b according to a control signal from the test control section 19. The pull down resistor 27 and the pull up resistor 28 are connected serially between a first voltage +V and a second voltage −V. A terminal of the capacitor 26 on a side that is not connected to the switch 25 is connected to a connection point of the pull down resistor 27 and the pull up resistor 28, and is also connected to the oscillating section 15.

The filter section 14 having the configuration described above functions as a high pass filter. Accordingly, the filter section 14 supplies to the oscillating section 15 a voltage that fluctuates according to the fluctuation amount of the power supply voltage Vdd, around a potential obtained through resistance-dividing by the pull down resistor 27 and the pull up resistor 28.

Figure 3:
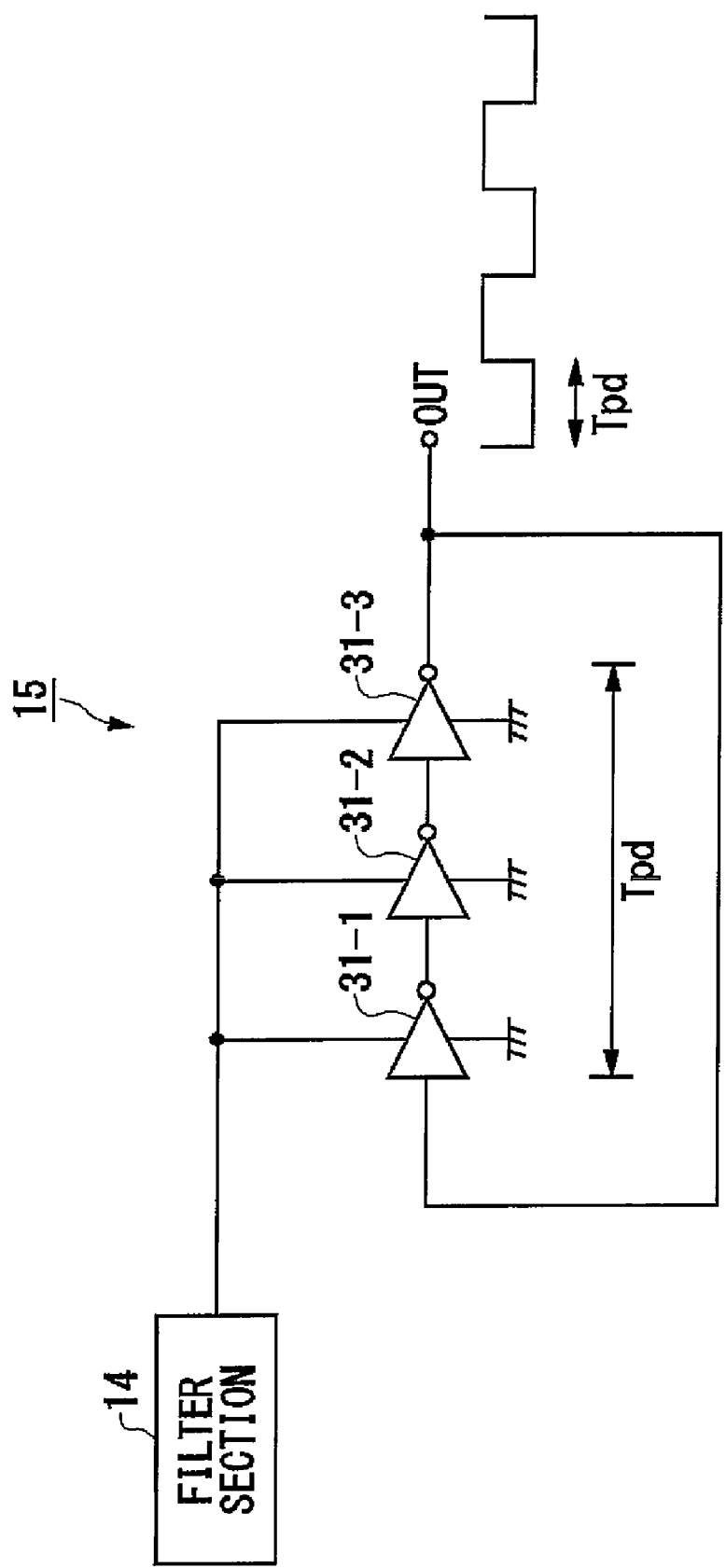
FIG. 3 shows an exemplary circuitry of an oscillating section 15 according to a present embodiment.

FIG. 3 shows the oscillating section 15 configured as a self looping oscillation circuit.

The oscillating section 15 configured as a self looping oscillation circuit may include, for example, an odd number (three, in the present embodiment) of negative logic elements 31 (31-1, 31-2, 31-3) connected in a loop and may output as the clock signal the output signal of any one of the negative logic elements 31 (31-1, 31-2, 31-3). Each negative logic element 31 is supplied with the voltage output form the filter section 14 as a driving voltage. More specifically, each negative logic element 31 operates using, as a voltage source, a voltage corresponding to the power supply voltage Vdd supplied to the power supply input terminal 1a of the DUT 1.

In the oscillating section 15 described above, in a case where the power supply voltage of the negative logic element 31 is lowered, the rising time of the negative logic element 31 is lengthened, which results in the oscillating section 15 generating a clock signal with a longer period. In a case where the power supply voltage of the negative logic element 31 is increased, the oscillating section 15 generates a clock signal having a shorter period. Therefore, the oscillating section 15 generates a clock signal having a frequency that corresponds to the power supply voltage Vdd supplied to the power supply input terminal 1a of the DUT 1.

As long as the oscillating section 15 can generate a clock signal having a frequency that corresponds to the voltage, it is not necessary that the oscillating section 15 be a self looping oscillation circuit. Furthermore, in the oscillating section configured as the self looping oscillation circuit, at least one of the negative logic elements 31 may operate using, as a voltage source, a voltage corresponding to the power supply voltage Vdd supplied to the power supply input terminal 1a of the DUT 1 by.

Figure 4:
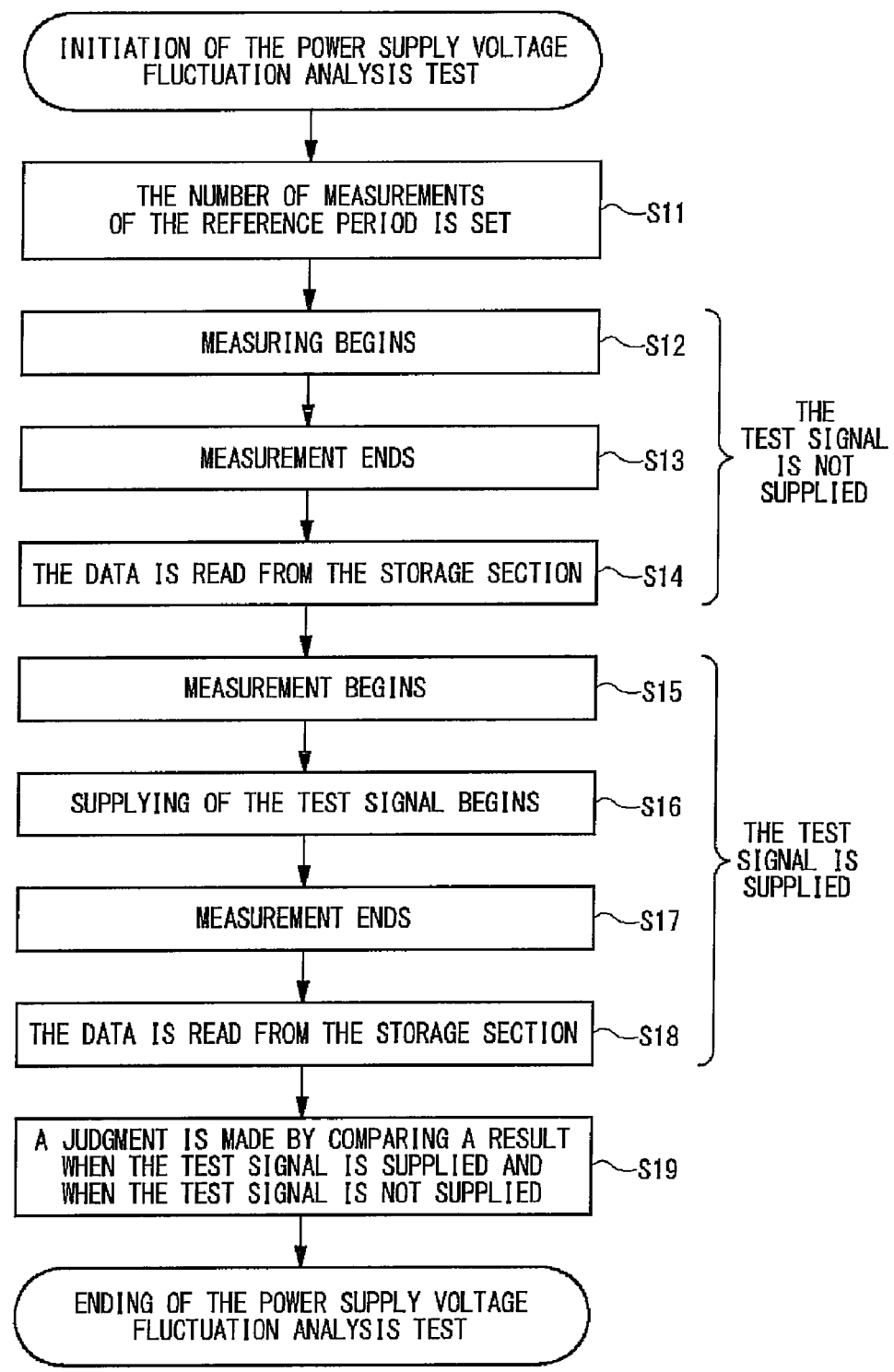
FIG. 4 is a flow chart showing a testing procedure of the power supply voltage fluctuation test.
Figure 5:
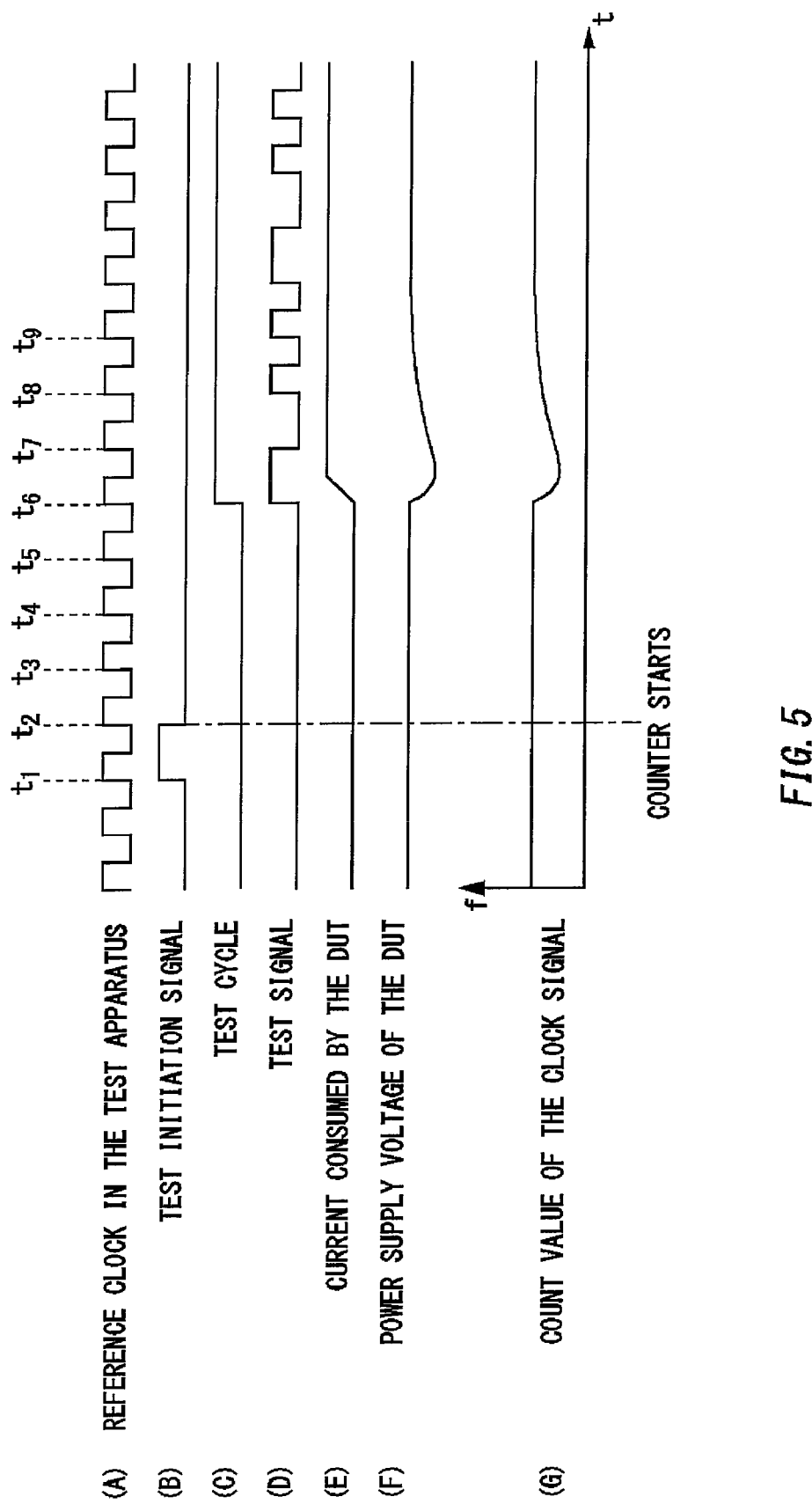
FIG. 5 is a timing chart of each signal of the test apparatus.

FIG. 4 is a flow chart showing a testing procedure of the power supply voltage fluctuation test. FIG. 5 shows a performance timing of a measuring apparatus 10 from step S15 to step S17 of FIG. 4. In FIG. 5, (A) represents the reference clock generated by the timing generating section 21, (B) represents a test initiation signal generated by the test control section 19, (C) represents a test cycle signal that is logic H during the test period, (D) represents the test signal supplied to a certain signal terminal 1b, (E) represents the current consumed by the DUT 1, (F) represents the power supply voltage Vdd supplied to the power supply input terminal 1a of the DUT 1, and (G) represents a count value of the number of pulses in the clock signal output from the oscillating section 15 in each reference period.

First, the test control section 19 sets a number of measurements of the reference period (step S11). More specifically, the test apparatus 10 sets a number of period units of the reference period over which the number of pulses in the clock signal will be measured.

Next, the test control section 19 initiates measurement by setting the test initiation signal to be logic H (step S12). When testing begins, the measuring section 16 counts the number of pulses in the clock signal in each reference period. The storage section 17 sequentially stores the number of pulses counted by the measuring section 16. At this time, the test control section 19 holds the DUT 1 in standby mode without supplying the test signal thereto. Therefore, the measuring section 16 measures a count value of the clock signal at a time when the power supply voltage Vdd is normal.

The test control section 19 then ends the measurement when the set number of measurements of the reference period have been completed (step S13).

Next, the power supply judging section 18 reads the data stored in the storage section 17 (step S14).

The test control section 19 then sets the test initiation signal to logic H to initiate testing (step S15, time t1). When testing begins, the measuring section 16 begins to count the number of pulses in the clock signal (time t2). The storage section 17 sequentially stores the number of pulses counted by the measuring section 16. At this time, the test control section 19 continues to hold the DUT 1 in standby mode without supplying the test signal thereto.

Next, the test control section 19 sets the test cycle signal to logic H and begins supplying the test signal to the DUT 1, thereby moving the DUT 1 from the standby mode to the operational mode (step S16, time t6).

At time t6, when the DUT 1 moves from the standby mode to the operational mode, the current consumed by the DUT 1 increases rapidly. When the current consumed by the DUT 1 increases rapidly, the power supply voltage Vdd temporarily decreases. When the level of the power supply voltage Vdd decreases, the power supply section 13 returns the power supply voltage Vdd to the normal level by increasing the power supply voltage Vdd with a feedback control (time t7). Here, the clock signal output from the oscillating section 15 has a frequency that fluctuates in accordance with the fluctuation of the power supply voltage Vdd. Therefore, the count value of the measuring section 16 decreases when the DUT 1 moves from the standby mode to the operational mode (time t6) and returns to the normal value thereafter (time t7).

Next, the test control section 19 ends the measurement when the set number of measurements of the reference period have been completed (step S17).

The power supply judging section 18 then reads the data stored in the storage section 17 (step S18).

Next, the power supply judging section 18 calculates the difference between the count value of the clock signal during the standby mode and the count value of the clock signal during the operational mode and, based on the difference, makes a judgment as to whether the fluctuation amount of the power supply voltage Vdd is within the allowable value range (step S19). More specifically, the power supply judging section 18 determines whether the difference between the count values is greater than or equal to a prescribed threshold value, and then makes a judgment that the fluctuation amount is greater than the allowable value when the difference is greater than or equal to the prescribed threshold value and makes a judgment that the fluctuation amount is within the allowable range when the difference is less than the prescribed threshold value.

After the judgment is made, the test apparatus 10 ends the test.

In the manner described above, the test apparatus 10 converts the fluctuation of the power supply voltage Vdd supplied to the DUT 1 into a frequency of a clock signal and measures the thus obtained frequency using a counter. By doing this, the test apparatus 10 can effectively measure the fluctuation of the power supply voltage Vdd supplied to the DUT 1.

Furthermore, the test apparatus 10 counts the number of pulses in the clock signal obtained in each reference period. Accordingly, even when an error arises in the period of each pulse because of noise, the test apparatus 10 can average the errors to reduce the effect of the noise, thereby increasing the measurement accuracy.

The type of measurement performed is not limited to the measurement described above, and a measurement may be used in the test apparatus 10 such that the device under test be judged as defective on a condition that the frequency measured by the measuring section 16 is outside of a predetermined reference range. Therefore, the test apparatus 10 can perform the power supply voltage fluctuation amount test while simultaneously performing a common test of the DUT 1, thereby decreasing the measurement time.

Furthermore, the power supply judging section 18 of the test apparatus 10 may make a judgment that an operational defect occurs in the DUT 1 due to an irregularity in the power supply voltage Vdd on the condition that the DUT 1 is judged to be defective by the pass/fail judging section 12 and that the fluctuation amount of the power supply voltage Vdd is not within the allowable range. By doing this, the test apparatus 10 can effectively judge there to be an operational defect in the DUT 1 due to an irregularity in the power supply voltage Vdd.

Even in a case where it is judged that an operational defect occurs due to an irregularity in the power supply voltage Vdd, it is possible for the DUT 1 to operate correctly by lowering the operational clock frequency. Therefore, on a condition that a judgment is made that an operational defect occurs in the DUT 1 due to an irregularity in the power supply voltage Vdd, the test signal supply section 11 may again supply the test signal to the DUT 1 at a lowered operational frequency, again perform the measurement of the DUT 1 in the operational mode (steps S15~18), and again perform the judging process using the newly obtained measurement result (step S19).

Even in a case where it is judged that an operational defect occurs due to an irregularity in the power supply voltage Vdd, it is possible for the DUT 1 to operate correctly by adjusting a back gate voltage that is applied to a substrate of a semiconductor chip. Therefore, on a condition that a judgment is made that an operational defect occurs in the DUT 1 due to an irregularity in the power supply voltage Vdd, the test signal supply section 11 may again supply the test signal to the DUT 1 having an adjusted back gate voltage, again perform the measurement of the DUT 1 in the operational mode (steps S15~18), and again perform the judging process using the newly obtained measurement result (step S19).

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A test apparatus that tests fluctuation of a power supply voltage supplied to a device under test, comprising:
   an oscillator that outputs a clock signal having a frequency that corresponds to the power supply voltage supplied to a power supply input terminal of the device under test;
   a measuring section that measures the frequency of the clock signal; and
   a power supply judging section that makes a judgment as to whether a fluctuation amount of the power supply voltage is within an allowable range, based on the frequency measured by the measuring section.

2. The test apparatus according to claim 1, wherein
   the oscillator outputs as the clock signal an output signal of any one negative logic element from among an odd number of negative logic elements connected in a loop, and at least one of the negative logic elements operates using, as a voltage source, a voltage corresponding to the power supply voltage supplied to the power supply input terminal of the device under test.

3. The test apparatus according to claim 1, further comprising a filter section that eliminates a DC component of the power supply voltage, wherein
   the oscillator outputs the clock signal having a frequency corresponding to the power supply voltage from which the DC component is eliminated.

4. The test apparatus according to claim 1, wherein the measuring section measures the frequency of the clock signal by counting a number of pulses in the clock signal within a predetermined reference period, further comprising a storage section that sequentially stores the number of pulses in the clock signal in each reference period.

5. The test apparatus according to claim 1, wherein the power supply judging section makes a judgment that the device under test is defective on a condition that the frequency measured by the measuring section is outside of a predetermined reference range.

6. The test apparatus according to claim 1, further comprising a test signal supply section that supplies a test signal that causes the device under test to operate to a signal terminal of the device under test, wherein
   the measuring section measures the frequency of the clock signal when the test signal is not supplied to the device under test and the frequency of the clock signal when the test signal is supplied to the device under test, and
   the power supply judging section makes a judgment as to whether the fluctuation amount of the power supply voltage is within the allowable range, based on a difference between the frequency of the clock signal when the test signal is not supplied to the device under test and the frequency of the clock signal when the test signal is supplied to the device under test.

7. The test apparatus according to claim 1, further comprising a test signal supply section that supplies a test signal that causes the device under test to operate to a signal terminal of the device under test, wherein
   the test signal supply section causes the device under test to move from a standby mode to an operational mode and supplies a predetermined test signal thereto, and
   the power supply judging section makes a judgment as to whether the fluctuation amount of the power supply voltage, which is caused by the operation of moving the device under test from the standby mode to the operational mode in response to the test signal, is within the allowable range, based on the frequency measured by the measuring section.

8. The test apparatus according to claim 1, further comprising:
   a test signal supply section that supplies a test signal that causes the device under test to operate to a signal terminal of the device under test; and
   a pass/fail judging section that makes a judgment concerning pass/fail of the device under test based on an output signal output by the device under test in response to the test signal, wherein
   the power supply judging section makes a judgment that an operational defect occurs in the device under test due to an irregularity in the power supply voltage, on a condition that the device under test is judged to be defective by the pass/fail judging section and the fluctuation amount of the power supply voltage is not within the allowable range.

9. The test apparatus according to claim 8, wherein the test signal supply section again supplies the test signal to the device under test, which has a lowered operational frequency, on a condition that the operational defect is judged to have occurred in the device under test due to an irregularity in the power supply voltage.

10. The test apparatus according to claim 8, wherein the test signal supply section changes a back gate voltage of the device under test according to the fluctuation amount of the power supply voltage and again supplies the test signal, on a condition that the operational defect is judged to have occurred in the device under test due to an irregularity in the power supply voltage.

11. The test apparatus according to claim 1, further comprising a power supply section that supplies the power supply voltage to the power supply input terminal of the device under test.

12. A test method for testing a fluctuation amount of a power supply voltage supplied to a device under test, comprising:
   supplying the power supply voltage to a power supply input terminal of the device under test;
   outputting a clock signal that has a frequency corresponding to the power supply voltage supplied to the power supply input terminal of the device under test;
   measuring the frequency of the clock signal; and
   making a judgment as to whether a fluctuation amount of the power supply voltage is within an allowable range, based on the measured frequency.

13. The test method according to claim 12, further comprising supplying the power supply voltage to the power supply input terminal of the device under test due to an irregularity in the power supply voltage.

14. The test method according to claim 12, wherein
   the clock signal is an output signal of any one negative logic element from among an odd number of negative logic elements connected in a loop, and at least one of the negative logic elements operates using, as a voltage source, a voltage corresponding to the power supply voltage supplied to the power supply input terminal of the device under test.

15. The test method according to claim 12, further comprising eliminating a DC component of the power supply voltage, wherein
   the clock signal has a frequency corresponding to the power supply voltage from which the DC component is eliminated.

16. The test method according to claim 12, wherein said measuring the frequency of the clock signal comprises counting a number of pulses in the clock signal within a predetermined reference period, said test method further comprising sequentially storing the number of pulses in the clock signal in each reference period.

17. The test method according to claim 12, wherein said judging comprises making a judgment that the device under test is defective on a condition that the measured frequency is outside of a predetermined reference range.

18. The test method according to claim 12, further comprising supplying a test signal that causes the device under test to operate to a signal terminal of the device under test, wherein
   said measuring comprising measuring the frequency of the clock signal when the test signal is not supplied to the device under test and the frequency of the clock signal when the test signal is supplied to the device under test, and
   said making a judgment comprises making a judgment as to whether the fluctuation amount of the power supply voltage is within the allowable range, based on a difference between the frequency of the clock signal when the test signal is not supplied to the device under test and the frequency of the clock signal when the test signal is supplied to the device under test.

19. The test method according to claim 12, further comprising supplying a test signal that causes the device under test to operate to a signal terminal of the device under test, wherein
   said supplying a test signal comprises causing the device under test to move from a standby mode to an operational mode and supplying a predetermined test signal thereto, and
   said making a judgment comprises making a judgment as to whether the fluctuation amount of the power supply voltage, which is caused by the operation of moving the device under test from the standby mode to the operational mode in response to the test signal, is within the allowable range, based on the measured frequency.

20. The test method according to claim 12, further comprising:
   supplying a test signal that causes the device under test to operate to a signal terminal of the device under test, and
   making a pass/fail judgment concerning pass/fail of the device under test based on an output signal output by the device under test in response to the test signal, wherein
   said making a judgment makes a judgment that an operational defect occurs in the device under test due to an irregularity in the power supply voltage, on a condition that the device under test is judged to be defective by said pass/fail judgment making and the fluctuation amount of the power supply voltage is not within the allowable range.

21. The test method according to claim 20, wherein said supplying a test signal comprises supplying the test signal to the device under test, which has a lowered operational frequency, on a condition that the operational defect is judged to have occurred in the device under test due to an irregularity in the power supply voltage.

22. The test method according to claim 20, wherein said supplying a test signal comprises changing a back gate voltage of the device under test according to the fluctuation amount of the power supply voltage and again supplying the test signal, on a condition that the operational defect is judged to have occurred in the device under test due to an irregularity in the power supply voltage.

* * * * *